United States Patent [19]

Granneman et al.

[11] Patent Number: 5,414,294
[45] Date of Patent: May 9, 1995

[54] REMOTE INDIUM BUMP CORRUGATED PV DIODES

[75] Inventors: Russell D. Granneman, Goleta; William O. McKeag, Santa Barbara, both of Calif.

[73] Assignee: Santa Barbara Research Center, Goleta, Calif.

[21] Appl. No.: 40,710

[22] Filed: Mar. 31, 1993

[51] Int. Cl.[6] .................... H01L 27/14; H01L 31/00; H01L 31/02
[52] U.S. Cl. ................................. 257/443; 257/448; 257/459; 257/466; 257/442; 257/623
[58] Field of Search ............... 257/442, 443, 447, 448, 257/452, 457, 459, 460, 466, 623, 624

[56] References Cited

U.S. PATENT DOCUMENTS 5,248,884 9/1993 Brewitt-Taylor et al. .......... 257/442

Primary Examiner—Andrew J. James
Assistant Examiner—Nathan K. Kelley
Attorney, Agent, or Firm—W. C. Schubert; W. K. Denson-Low

[57] ABSTRACT

A radiation detector includes a photovoltaic diode mesa structure (16) having of a plurality of sub-mesa structures (16a, 16b). Each of said sub-mesa structures includes a first layer (14a) of semiconductor material having a first type of electrical conductivity and a second layer (14b) having a second type of electrical conductivity such that a p-n junction is formed between the first and the second layers. Metalization (24) is disposed within a trench (30a) that runs between the sub-mesas and includes a tab portion (24a) that extends upwardly over a sidewall of each of said sub-mesa structures so as to electrically contact the second layer contained within each. As a result, each of said sub-mesa structures are electrically connected in parallel. The trench is disposed parallel to a radiation scan axis of the radiation detector and orthogonal to a radiation cross-scan axis of the radiation detector for reducing a width of surface features across the scan axis, thereby reducing a light signature of the detector.

17 Claims, 3 Drawing Sheets

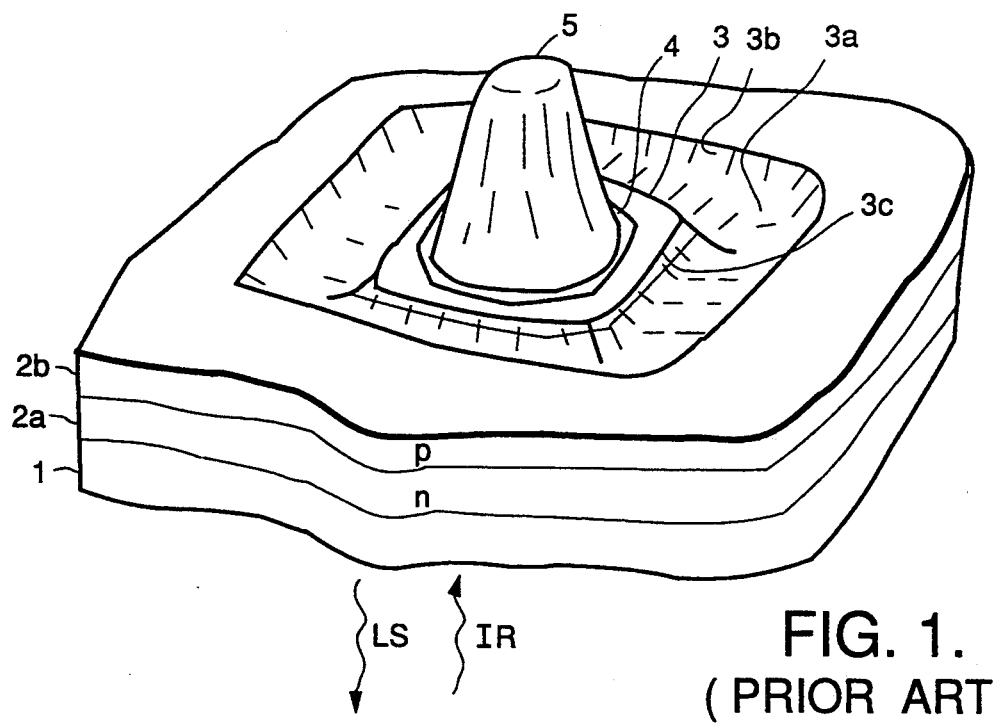
FIG. 1.
(PRIOR ART)
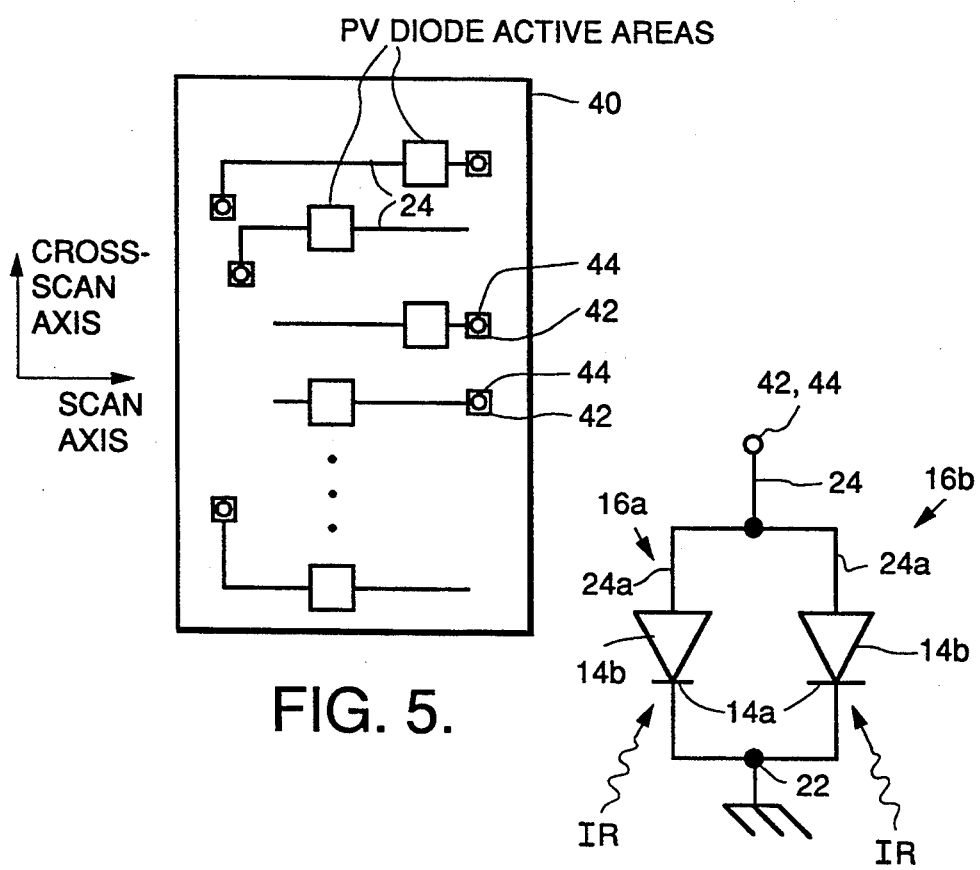
FIG. 5.
FIG. 6.

REMOTE INDIUM BUMP CORRUGATED PV DIODES

FIELD OF THE INVENTION

This invention relates generally to radiation detectors, and relates particularly to back-side illuminated detectors of infrared (IR) radiation.

BACKGROUND OF THE INVENTION

IR radiation detectors provide an electrical output which is a measure of incident IR radiation. One particularly useful IR detector is a photovoltaic (PV) detector fabricated from Group II–VI radiation absorbing semiconductor material, such as mercury-cadmium-telluride (HgCdTe). HgCdTe detectors are typically fabricated as linear and two-dimensional arrays, also known as Focal Plane Arrays (FPAs).

As seen in FIG. 1, generally a transparent substrate 1 supports a radiation absorbing semiconductor layer 2a having a first electrical conductivity. A second semiconductor layer 2b of opposite electrical conductivity forms a p-n junction with the first layer.

The array may be differentiated into a plurality of p-n junctions by selectively etching the semiconductor layers 2b and 2a, resulting in the formation of a plurality of upstanding "mesa" structures, each of which contains a radiation detecting element, or pixel. One such mesa structure 3 is shown in FIG. 1, the mesa structure 3 being contained within an etched depression or trench 3a having sidewalls 3b. The mesa structure 3 itself has surrounding sidewalls 3c.

The array typically also includes a layer of passivation applied to outer surfaces so as to reduce surface states and the resulting noise signals that detrimentally affect the operation of the p-n junction. An anti-reflection (AR) coating may also be applied over the passivation layer to reduce reflections of incident radiation.

The mesa structure 3 has an electrical contact that is typically provided in the form of one or more square or round metal pads 4. The contact pad(s) 4 provide electrical contact for external read-out circuitry (not shown), usually via an indium "bump" interconnect 5, to the p-n junction. The external read-out circuitry is bonded to the indium bumps 5 to form a hybridized FPA/read-out assembly.

If radiation enters the array through the bottom surface of the substrate, that is, the surface opposite to the surface that supports the radiation absorbing semiconductor layer, the array is referred to as a "backside-illuminated" array.

It is conventional practice to scan incident radiation over the array, particularly linear arrays, with a rotating mirror or the like. The direction of the scanned radiation is referred to as a scan axis, and a cross-scan axis is defined to be an axis perpendicular to the scan axis. It is also conventional practice to tilt or rotate the detector array about an axis such that a radiation receiving surface of the array is inclined at an angle to incident radiation. This rotation of the array may be accomplished for both scanned and unscanned, or "staring", detector arrays.

A problem that is presented during the use of such detector arrays results from reflection of radiation from the edges of the contact pads 4, sidewall surfaces 3b and 3c, and other top-side surface structures. This reflected radiation is radiation that first passes unabsorbed through the substrate 1, the radiation absorbing semiconductor layer 2a, and the overlying layer 2b of opposite conductivity. This unabsorbed radiation eventually encounters the array top-side edges and features and is reflected therefrom back through the body of the array. If the reflected radiation is not absorbed during the second pass through the array, the radiation emerges from the bottom surface of the substrate 1 and may propagate back into space. This propagating radiation signal is often referred to as a "light signature" (LS).

In order to minimize the light signature originating from the trench walls 3b and mesa sidewalls 3c, the wall widths must be reduced to be much smaller than an optical blur diameter. The optical blur diameter is given by 1.22 times the wavelength, divided by the numerical aperture, as described by W. J. Smith, "Modern Optical Engineering", pages 138–140 (McGraw-Hill, Inc., 1966). In general, as the feature width is decreased along the cross-scan axis, the magnitude of the light signature also decreases. Thus, the cross-scan width of a feature is proportional to its light signature. A leveling off of the light signature occurs at a feature width/optical blur diameter of unity.

One possible method to achieve the reduction in mesa wall widths would be to miniaturize the mesa diode. However, there are limitations as to a minimum useful diode size. Specially designed absorptive coatings may also be employed to reduce the light signature, although the use of such coatings complicates the array fabrication process.

What is thus an object of this invention to provide is a radiation detector having a novel metalization routing technique, in combination with a mesa structure that is differentiated into a plurality parallel-connected sub-mesas, each sub-mesa containing a PV diode.

A further object of this invention is to provide an array of radiation detectors wherein contact pad terminators and indium bump interconnects are physically located away from the illuminated active areas of the radiation detectors, such as at a periphery of the array.

SUMMARY OF THE INVENTION

The foregoing problems are overcome and other advantages are realized in a PV diode array that reduces the light signature by reducing the physical width of the mesa and trench walls to a fraction of the optical blur diameter. In accordance with this invention, the light signature is reduced by fabricating multiple juxtaposed reduced area PV diodes, coupled electrically in parallel, to provide a larger effective area for a PV diode.

The teaching of the invention significantly reduces unwanted edge reflections by reducing the diode's physical size through a corrugation of the diode mesa structure in the cross-scan axis. Edge reflections are further reduced by relocating the contact pad/indium bump to a non-illuminated region of the FPA.

The PV diode structure taught by the invention reduces the optical signature of a PV HgCdTe focal plane without requiring absorptive coatings and, furthermore, tends to increase the laser damage hardness of the focal plane. The teaching of the invention furthermore enables the indium bump placement to be prescribed by hybrid assembly reliability goals, instead of by the active area pixel layout.

That is, the invention provides multiple linear PV diodes to reduce a physical width of a single PV diode in the cross-scan axis, thereby improving the optical signature by reducing unwanted reflections.

The invention furthermore provides for electrically coupling multiple diodes together in parallel to achieve a desired PV diode active area requirement.

The invention also provides for "corrugating" the area between active PV diode area cells in the in-scan axis so that trench outer walls are reduced in effective width in the cross-scan axis.

The invention also provides for individual electrical traces to be routed along inner surfaces of the corrugation troughs. The traces may encompass the entire inner area of a trough, or some portion thereof. The traces continue, as do the corrugations, along the scan axis for a prescribed distance away from the active PV diode cells. The prescribed distance is such that externally provided shields, baffles and/or field stops can be employed to prevent the illumination of the trace terminations, thereby eliminating reflections from the terminations.

Relatedly, the invention enables the contact pads and associated indium bumps to be remotely located such that they are also hidden from illumination. As a result, the physical layout of the contact pads and indium bumps are not constrained by the geometry of the FPA active area, but may instead be optimized to improve the reliability of a hybrid assembly of which the FPA is a part.

In accordance with an aspect of the invention there is provided an array of radiation detectors having a reduced light signature. Individual ones of the radiation detectors each comprise (a) a plurality of radiation responsive regions; (b) an electrical contact disposed for electrically coupling together each of the plurality of radiation responsive regions into an effective radiation responsive region having an area that encompasses each of the plurality of radiation responsive regions; and (c) an electrical termination that is electrically coupled to the electrical contact at a point that is outside of the area of the effective radiation responsive region.

The electrical contact includes an electrically conductive trace that has a length that is greater than a width. The length of the trace is disposed parallel to a radiation scan axis of the array of radiation detectors. The electrical termination includes a contact pad having an indium bump interconnect formed thereon.

Further in accordance with the invention there is provided a radiation detector that includes a mesa structure comprised of a plurality of sub-mesa structures. Each of the sub-mesa structures includes a first region of semiconductor material having a first type of electrical conductivity and a second region of semiconductor material that overlies the first region and is in contact therewith. The second region has a second type of electrical conductivity and forms a p-n junction between the first and the second regions. An electrical contact has a first portion disposed between the plurality of sub-mesa structures and a second portion that extends upwardly over a sidewall of each of the sub-mesa structures so as to electrically contact the second region of each of the sub-mesa structures for electrically connecting each of the plurality of second regions one with another.

The mesa structure includes at least one trench that runs through the mesa structure for dividing the mesa structure into the plurality of sub-mesa structures. The electrical contact is comprised of a layer of metalization that is disposed within the at least one trench.

BRIEF DESCRIPTION OF THE DRAWING

The above set forth and other features of the invention will be made more apparent in the ensuing Detailed Description of the Invention when read in conjunction with the attached Drawing, wherein:

FIG. 1 is an elevational view, not to scale, that shows a backside illuminated, mesa PV diode of the prior art;

FIG. 5 is a top view, not to scale, showing a linear FPA of PV diodes that are constructed in accordance with the invention; and FIG. 6 is schematic diagram showing one PV diode of the invention that includes two parallel connected PV diodes.

DETAILED DESCRIPTION OF THE INVENTION

Figure 2:
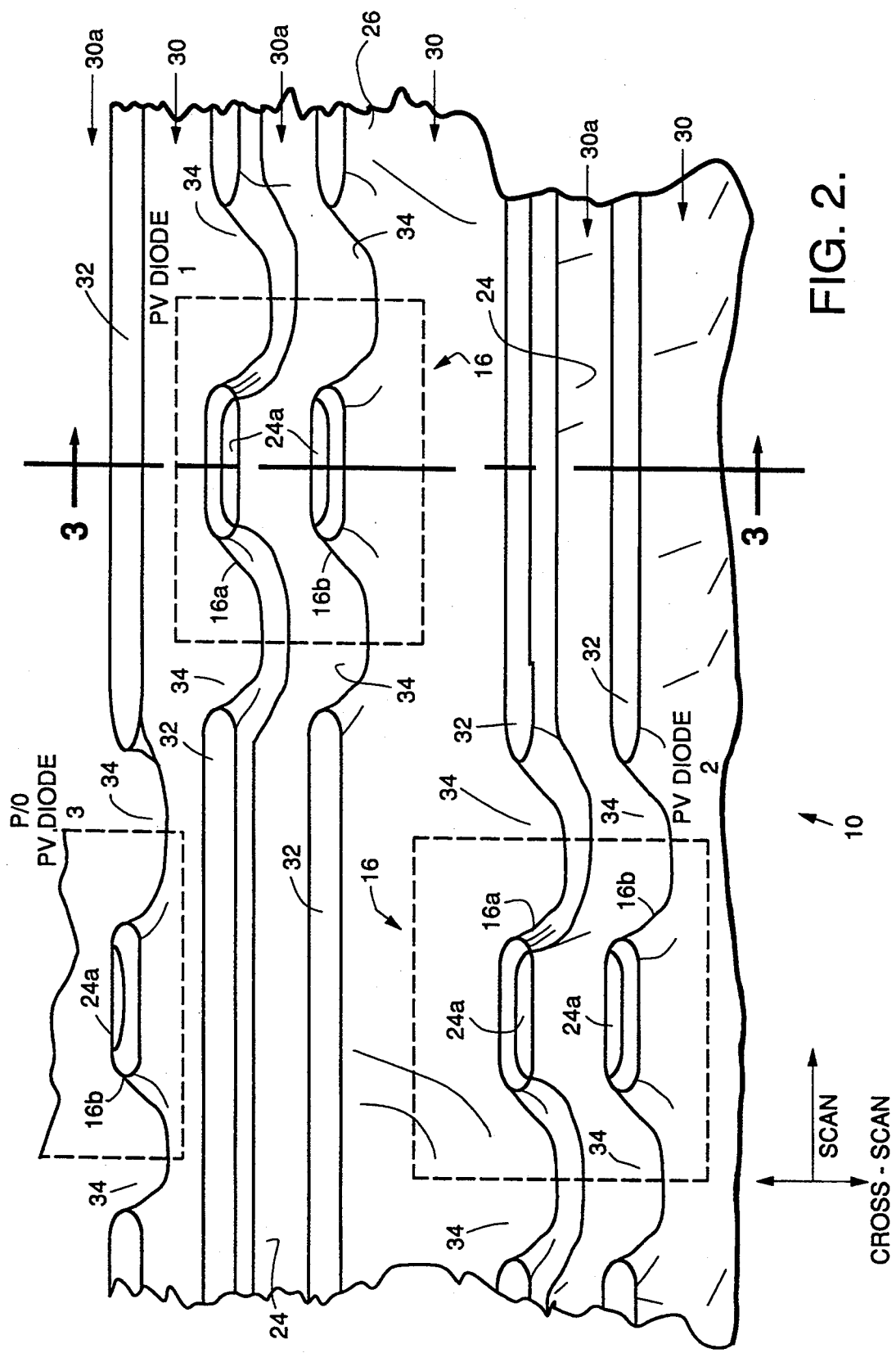
FIG. 2 is an elevational view, not to scale, showing a portion of an array of PV diodes that are constructed in accordance with the invention.
Figure 3:
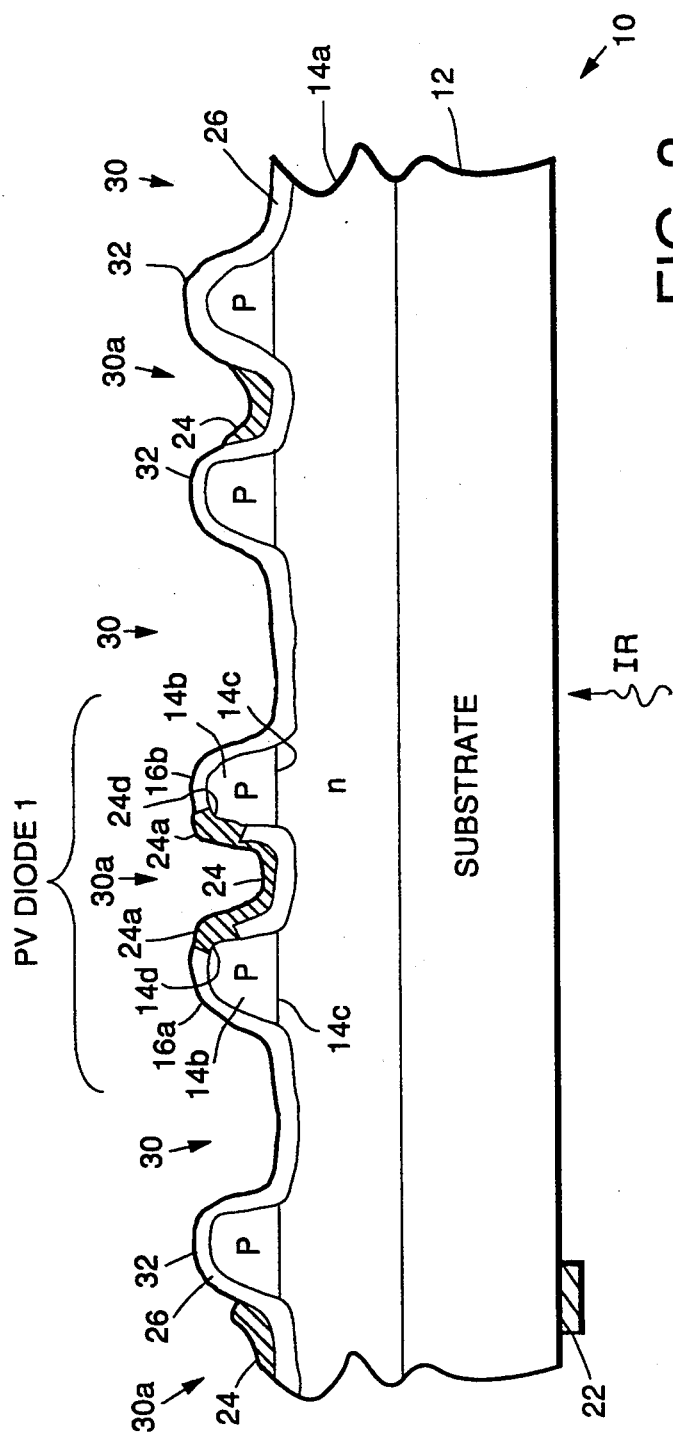
FIG. 3 is a cross-sectional view, not to scale, taken along the section line 3—3 of FIG. 2.

FIG. 2 is an elevational view, not to scale, of a portion of a backside illuminated, linear radiation detector array 10. FIG. 3 is a cross-sectional view of the array 10, taken along the section line 3—3 of FIG. 2. For the illustrated embodiment, the array 10 is comprised of Group II–VI material and is responsive to IR radiation. One suitable material is HgCdTe.

IR radiation is incident upon and passes through a transparent and electrically insulating substrate 12. The IR radiation passes into and is absorbed within an n-type radiation absorbing layer 14a, wherein the absorbed radiation generates electron-hole pairs. Overlying the n-type layer 14a is a p-type layer. The radiation absorbing layer 14a and the p-type layer are differentiated into a plurality of mesa structures 16, which are in turn differentiated into a first sub-mesa structure 16a and a second sub-mesa structure 16b. Individual ones of each of the sub-mesa structures 16a and 16b each contain a portion of the p-type layer as a p-type cap layer 14b that overlies the n-type layer 14a and forms a p-n junction 14c therewith.

In accordance with an aspect of the invention, the array 10 is processed to form a plurality of troughs or trenches 30 that run parallel to one another and to a predetermined scan axis of the array. The trenches 30 are etched or milled to a depth that extends completely through the p-type cap layer 14b and partially into the n-type layer 14a. A typical trench depth is two to three microns, and a typical trench width is approximately 10 microns. As a result, the p-n junction between the layers 14b and 14a is differentiated into a plurality of linear p-n junctions that are contained within trench walls 32. At positions where a PV diode is desired, such as the PV diodes PV DIODE1, PV DIODE2, and PV DIODE3, the trench walls 32 are etched or milled through the layer 14b and partially into the layer 14a so as to form the regions 34. This results in the formation of the two sub-mesas 16a and 16b between two non-adjacent trenches 30, with a trench 30a running between the two non-adjacent trenches 30. Chemical etching, ion milling, or reactive ion etching, performed through apertures within an appropriately patterned masking layer, are three suitable methods of forming the trenches 30, 30a, and the regions 34.

Formed over the cap layer 14b, the mesa sidewalls, the surfaces of the trenches 30 and 30a, and over the surfaces of the regions 34 is a passivation layer 26. The passivation layer 26 may be comprised of a layer of wider-bandgap semiconductor material, such as a layer of CdTe. After depositing the passivation layer 26, a suitably patterned mask is applied and a passivation etch occurs along a narrow strip at the periphery of each sub-mesa top surface that is adjacent to the trench 30a. The passivation etch exposes a portion 14d of the cap layer 14b. A subsequent metalization step deposits contact metal as linear metalic traces 24 within the trenches 30a, and also deposits contact metal up and over the sub-mesa sidewalls to contact the exposed portion 14d of the cap layer 14b. The result is the formation of a metal contact tab 24a to each cap layer 14b. The contact metal tab 24a is significantly smaller in area than the conventional mesa contact 4 of FIG. 1 and, as a result, the amount of contact metal on the top of the mesa is reduced. This is desirable to minimize reflections from the mesa contact metalization.

Figure 4:
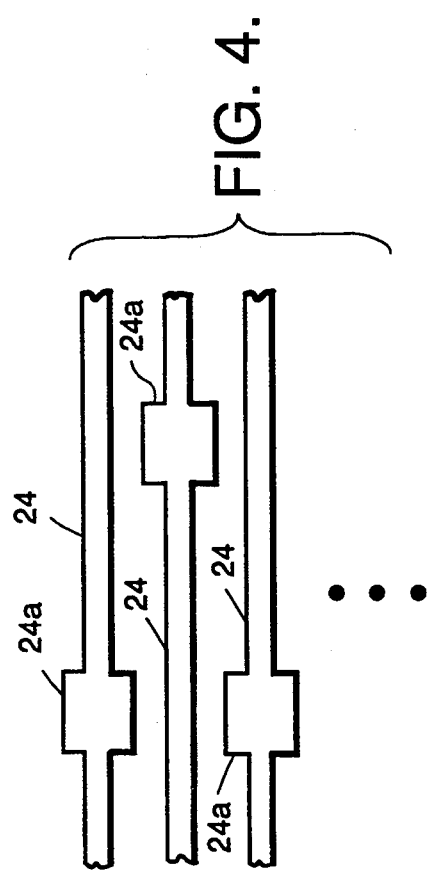
FIG. 4 illustrates one embodiment of a metalization mask that is employed during the fabrication of the array of FIGS. 2 and 3.

During the metalization process a metal film, such as Au, Pt, or Al, is selectively deposited by, for example, sputtering, thermal evaporation, or electron beam deposition, into the trenches 30a so as to form the metallic traces 24. A portion of the metalization is also deposited partially over the mesa cap layers 14b to form the contact tabs 24a. One suitable metalization mask is shown in FIG. 4. Preferably, the tabs 24a are designed so as to minimize the metal strip width variations.

The width of each of the traces 24 may be such that substantially all of the inner surface area of each trench 30a is covered, or may be selected to cover only a bottom portion of each trench 30a. Intermediate widths may also be selected. A typical width of the traces 24 is in the range of six to eight microns.

When viewed from directly above, the contact metal 24 appears as continuous strips of constant width, except for the tabs 24a that extend over the tops of the sub-mesas 16a and 16b to contact the exposed portions 14d of the cap layers 14b.

Prior to the above described processing step of forming the trenches 30 and 30a, the n-type layer 14a and the overlying p-type layer are grown on the substrate 12 by a suitable process, such as Liquid Phase Epitaxy (LPE), Molecular Beam Epitaxy (MBE), or Chemical Vapor Deposition (CVD).

A highly conductive p+ layer (not shown) may be optionally employed to reduce the contact resistance between the contact tab 24a and the p-type cap layer 14b. The p+ layer, if used, is formed over the p-type cap layer 14b such that the contact tab 24a is deposited upon the p+ layer. An optional anti-reflection coating (not shown) may also be deposited over the passivation layer 26, and also over the radiation receiving surface of the substrate 12.

Based on the foregoing description, and in accordance with a method of the invention, there is provided a process for fabricating an array of photovoltaic diodes. The process includes a first step of (a) providing a substrate having a first semiconductor layer formed upon a surface thereof, the first semiconductor layer being a radiation responsive layer having a first type of electrical conductivity. The first step of providing a substrate further provides a second semiconductor layer formed upon the first semiconductor layer, the second semiconductor layer having a second type of electrical conductivity for forming a p-n junction with the first semiconductor layer.

A second step (b) forms a plurality of trenches through the second semiconductor layer and partially through the first semiconductor layer for differentiating the p-n junction into a plurality of p-n junctions. The plurality of trenches are formed so as to be disposed parallel to one another and to include, for each photovoltaic diode of the array, two non-adjacent trenches having a third trench interposed therebetween. Each of the two non-adjacent trenches is separated from the third trench by a trench wall. The second step of forming a plurality of trenches includes a step of removing portions of the trench walls so as to leave two adjacently disposed portions of the trench walls. The two adjacently disposed portions of the trench walls each contain a p-n junction and define two adjacently disposed mesa structures each having sidewalls that meet the first semiconductor layer.

A third step (c) applies metalization within the third trench and between the two adjacently disposed mesa structures. The metalization is applied so as to extend up a sidewall of each of the two adjacently disposed mesa structures for electrically coupling to a portion of the second semiconductor layer that is disposed within each of the two adjacently disposed mesa structures.

The second step of forming forms the trenches such that they are disposed, during use of the array, in a parallel orientation to a radiation scan axis of the radiation detector array and orthogonally to a radiation cross-scan axis of the array. The third trench is formed to extend away from the two adjacently disposed mesa structures.

A fourth step (d) forms a termination means that is electrically coupled to the metalization within the third trench at a point remote from the two adjacently disposed mesa structures. The step of forming the termination means includes the steps of forming a contact pad and depositing an indium bump interconnect upon the contact pad.

The second step of forming includes the further steps of (b1) depositing a passivation layer over exposed surfaces of the trenches and mesa structures; and (b2) opening an aperture within the passivation layer at an upper region of each of the mesa structures so as to expose an underlying portion of the second semiconductor layer. The third step of applying the metalization applies the metalization over the passivation layer and into each of the apertures for contacting the exposed portion of the second semiconductor layer.

During use of the array 10 that is fabricated in accordance with the invention, incident radiation is scanned across the backside of the FPA 10 along the scan axis. Under the influence of a bias voltage, applied between mesa contact tabs 24a and a common contact 22, minority carriers diffuse toward the p-n junctions 14c and are collected. Lateral collection of minority charge carriers generally occurs within the region shown in dashed outline in FIG. 2, the enclosed dashed region being considered as the active area for each of the PV DIODES 1, 2, and 3. The overlap of the lateral collection areas of each of the sub-mesas 16a and 16b results in an active area that is comparable to that of the conventional unitary mesa structure of FIG. 1. As a result, a reduction in PV diode feature size is achieved, with a corresponding reduction in the light signature, without incurring a corresponding reduction in the quantum efficiency or signal to noise ratio of each of the PV diodes. By example, each of the active areas shown in FIG. 2 is approximately 40 microns square.

Referring to FIG. 5 there is shown a top view, not to scale, of a FPA 40 comprised of a plurality of the PV diodes shown in FIGS. 2 and 3. As can be seen, the metallic traces 24 are aligned parallel to the FPA 40 scan axis. Each of the metallic traces 24 is terminated at a peripheral portion of the FPA 40 with a contact pad 42 having an indium bump interconnect 44 disposed thereon. FIG. 5 thus illustrates an aspect of the invention that provides for the placement of the indium bump interconnects 44 remotely from the FPA active areas. Preferably, the indium bump interconnects 44 are positioned at a region of the FPA 40 that is shielded from the scanned radiation. This shielding is provided through the use of externally mounted shields, baffles and/or field stops that are placed so as to prevent the illumination of the trace 24 terminations. As a result, unwanted reflections from the contact pads 42 and the indium bump interconnects 44 are significantly reduced or eliminated. Furthermore, the exact placement of the indium bump interconnects 44 may be determined by considerations relating to improving the mechanical and electrical integrity of a subsequently formed hybrid device that includes the FPA 40. That is, the positioning of the indium bump interconnects 44 is decoupled from the geometry of the FPA active area.

FIG. 6 is a schematic diagram of the PV DIODE1 and shows the correspondence between the various structures shown in FIGS. 2, 3, and 5. It should be realized that the mesa structure may be differentiated into more than two of the sub-mesas 16a and 16b through the use of more than one of the trenches 30a. Consequently, more than two parallel diodes would thus be provided.

Although described in the context of a PV Group II-VI scanned array of IR detectors, it should be realized that the teaching of the invention is not limited thereto. For example, the teaching of the invention may also be applied to n-on-p devices and also to photoconductive detectors. In general, single devices, linear arrays, and two-dimensional arrays of scanned or unscanned radiation detectors may benefit from the teaching of the invention. The teaching of the invention is also not limited for use only with IR detectors, but may also be employed with back-side illuminated radiation detectors responsive to the visible and other spectrums. The teaching of the invention may also be employed with detectors comprised of other materials, such as Group IV material and Group III-V material.

Thus, based on the foregoing teaching those having skill in the art may derive modifications to the embodiment of the invention disclosed above. The invention is therefore not to be construed to be limited only to this disclosed embodiment, but is instead intended to be given a breadth commensurate with the scope of the claims that follow.

What is claimed is:

1. A radiation detector, comprising:
   a first layer of semiconductor material having a first type of electrical conductivity;
   a mesa structure comprised of a plurality of sub-mesa structures, each of said sub-mesa structures comprising a portion of said first layer of semiconductor material having the first type of electrical conductivity, each of said sub-mesa structures being electrically coupled together by said first layer and further comprising a second layer of semiconductor material overlying said portion of the first layer and in electrical contact therewith, said second layer having a second type of electrical conductivity and forming a p-n junction between said portion of said first layer and said second layer, at least two of said plurality of sub-mesa structures being separated by at least one trench that extends partially through said first layer; and
   electrical contact means having a first portion disposed within said at least one trench between said plurality of sub-mesa structures and a second portion that extends upwardly from said at least one trench and over a sidewall of each of said sub-mesa structures so as to electrically contact said second region of each of said sub-mesa structures for electrically connecting each of the plurality of second regions one with another.

2. A radiation detector as set forth in claim 1 wherein said electrical contact means is comprised of a layer of metalization.

3. A radiation detector as set forth in claim 2 wherein said at least one trench is disposed parallel to a radiation scan axis of the radiation detector and orthogonal to a radiation cross-scan axis of the radiation detector.

4. A radiation detector as set forth in claim 2 wherein said at least one trench extends away from said mesa structure, and further including termination means that is electrically coupled to said electrical contact means at a point remote from said mesa structure.

5. A radiation detector as set forth in claim 4 wherein said termination means includes a contact pad having an indium bump interconnect formed thereon.

6. A photovoltaic diode, comprising:
   a substrate;
   a first semiconductor layer formed upon said substrate, said first semiconductor layer comprising a radiation responsive layer having a first type of electrical conductivity;
   a second semiconductor layer formed upon said first semiconductor layer, said second semiconductor layer having a second type of electrical conductivity for forming a p-n junction with said first semiconductor layer;
   a plurality of trenches formed through said second semiconductor layer and partially through said first semiconductor layer for differentiating said p-n junction into a plurality of p-n junctions, said plurality of trenches being disposed parallel to one another and including two non-adjacent trenches having a third trench interposed therebetween, said two non-adjacent trenches being separated from said third trench by a first trench wall and by a second trench wall, respectively, said first trench wall and said second trench wall each having a plurality of gaps formed therein, each of said gaps extending through said second semiconductor layer and partially through said first semiconductor layer;
   a photovoltaic diode active site comprising a region of said first semiconductor layer that encompasses an area that includes at least a portion of said plurality of gaps within said first trench wall and within said second trench wall, said plurality of gaps being disposed so as to leave adjacently disposed portions of trench wall within said first trench wall and within said second trench wall, said adjacently disposed portions of said first and second trench walls each containing a p-n junction and defining two adjacently disposed mesa structures each having sidewalls that meet said first semiconductor layer;

a layer of electrically insulating material covering substantially all exposed surfaces of said plurality of trenches and said mesa sidewalls; and electrical contact means overlying said layer of electrically insulating material, said electrical contact means being disposed within said third trench and running between said two adjacently disposed mesa structures, said electrical contact means including means, disposed upon a sidewall of each of said two adjacently disposed mesa structures, for electrically coupling to said electrical contact means a portion of said second semiconductor layer that is disposed within each of said two adjacently disposed mesa structures.

7. A radiation detector as set forth in claim 6 wherein said plurality of trenches are disposed parallel to a radiation scan axis of the radiation detector and orthogonal to a radiation cross-scan axis of the radiation detector.

8. A radiation detector as set forth in claim 6 wherein said third trench extends away from said photovoltaic diode active site, and further including termination means that is electrically coupled to said electrical contact means at a point remote from said photovoltaic diode active site.

9. A radiation detector as set forth in claim 8 wherein said termination means includes a contact pad having an indium bump interconnect formed thereon.

10. A radiation detector as set forth in claim 6 wherein there are a plurality of said photovoltaic diode active sites disposed over said substrate, wherein said third trench of each of said photovoltaic diode active sites extends away from the associated photovoltaic diode active site, and further including a plurality of termination means individual ones of which are electrically coupled to one of said plurality of electrical contact means at a point remote from said photovoltaic diode active sites, and wherein each of said plurality of termination means includes a contact pad having an indium bump interconnect formed thereon.

11. A radiation detector as set forth in claim 10 wherein each of said plurality of trenches are disposed parallel to a radiation scan axis of the radiation detector and orthogonal to a radiation cross-scan axis of the radiation detector.

12. A radiation detector as set forth in claim 6 wherein said first semiconductor layer and said second semiconductor layer are each comprised of Group II–VI semiconductor material.

13. A radiation detector as set forth in claim 6 wherein said means for electrically coupling is disposed for contacting a peripheral portion of said second semiconductor layer within each of said mesa structures.

14. A radiation detector as set forth in claim 6 wherein said layer of electrically insulating material is comprised of a passivation layer that overlies surfaces of said trenches and mesa structures, and wherein said means for electrically coupling contacts a peripheral portion of said second semiconductor layer through an opening that is made through said passivation layer.

15. An infrared (IR) radiation-responsive array of photovoltaic diodes, comprising:

a substrate that is substantially transparent to IR radiation having wavelengths of interest, said substrate having a radiation-receiving first major surface and an opposite, second major surface;

a first Group II–VI alloy semiconductor layer formed over said second major surface of said substrate, said first semiconductor layer comprising an electromagnetic radiation-responsive layer having a first type of electrical conductivity;

a second Group II–VI alloy semiconductor layer formed over said first semiconductor layer, said second semiconductor layer having a second type of electrical conductivity for forming a p-n junction with said first semiconductor layer;

a plurality of trenches formed through said second semiconductor layer and partially through said first semiconductor layer for differentiating said p-n junction into a plurality of photovoltaic diodes, said plurality of trenches being disposed parallel to one another and including two non-adjacent trenches having a third trench interposed therebetween, said two non-adjacent trenches being separated from said third trench by a first trench wall and by a second trench wall, respectively, said first trench wall and said second trench wall each having a plurality of gaps formed therein, each of said gaps extending through said second semiconductor layer and partially through said first semiconductor layer;

each photovoltaic diode comprising a photovoltaic diode active site contained within a region of said first semiconductor layer that encompasses an area that includes at least a portion of said plurality of gaps within said first trench wall and within said second trench wall, said plurality of gaps being disposed so as to leave adjacently disposed portions of trench wall within said first trench wall and within said second trench wall, said adjacently disposed portions of said first and second trench walls each containing a p-n junction and defining two adjacently disposed mesa structures within said active site, each of said two adjacently disposed mesa structures having sidewalls that meet said first semiconductor layer;

a surface passivation layer covering substantially all exposed surfaces of said plurality of trenches and said mesa sidewalls; and electrical contact means overlying said surface passivation layer and disposed within said third trench between said two adjacently disposed mesa structures, said electrical contact means including means, disposed upon a sidewall of each of said two adjacently disposed mesa structures, for electrically coupling through openings in said passivation layer to a portion of said second semiconductor layer that is disposed within each of said two adjacently disposed mesa structures; wherein during the use of said array IR radiation is incident upon said first surface of said substrate and said plurality of trenches are disposed parallel to an IR radiation scan axis of the array and orthogonal to an IR radiation cross-scan axis of the array.

16. An IR radiation-responsive array of photovoltaic diodes as set forth in claim 15 wherein said passivation layer is comprised of a Group II–VI semiconductor material.

17. An IR radiation-responsive array of photovoltaic diodes as set forth in claim 15 wherein there are a plurality of said photovoltaic diode active sites, wherein said third trench of each of said photovoltaic diode active sites extends away from the associated photovoltaic diode active site, and further including a plurality of termination means individual ones of which are electrically coupled to one of said plurality of electrical contact means at a point remote from said photovoltaic diode active sites, and wherein each of said plurality of termination means includes a contact pad having an indium bump interconnect formed thereon.

* * * * *